United States Patent
Liquicia et al.

(10) Patent No.: US 9,496,865 B1
(45) Date of Patent: Nov. 15, 2016

(54) ACTIVE ISOLATION SWITCH

(71) Applicant: COMPUWARE TECHNOLOGY INC., New Taipei (TW)

(72) Inventors: Marcos-Agoo Liquicia, New Taipei (TW); Chien-Ta Liang, New Taipei (TW)

(73) Assignee: COMPUWARE TECHNOLOGY INC., New Taipei (TW)

( * ) Notice: Subject to any disclaimer, the term of this patent is extended or adjusted under 35 U.S.C. 154(b) by 0 days.

(21) Appl. No.: 14/951,506

(22) Filed: Nov. 25, 2015

(51) Int. Cl.
*H03K 17/567* (2006.01)
*H03K 17/60* (2006.01)
*H03K 17/687* (2006.01)

(52) U.S. Cl.
CPC ............ *H03K 17/567* (2013.01); *H03K 17/60* (2013.01); *H03K 17/687* (2013.01)

(58) Field of Classification Search
CPC .................................................. H03K 17/567
See application file for complete search history.

(56) References Cited

U.S. PATENT DOCUMENTS

| | | | | |
|---|---|---|---|---|
| 7,190,207 B2* | 3/2007 | Chen | .................... | H03K 17/063 327/365 |
| 8,514,008 B2* | 8/2013 | Yan | ..................... | H03K 17/063 327/387 |
| 8,810,302 B2* | 8/2014 | Bottarel | ............... | B06B 1/0215 327/365 |

* cited by examiner

*Primary Examiner* — Hai L Nguyen
(74) *Attorney, Agent, or Firm* — Leong C. Lei

(57) ABSTRACT

An active isolation switch according to this invention includes a field effect transistor (FET), a first bi-polar transistor and a second bi-polar transistor, and an emitter bias resistor. The FET is formed with a source, a gate, and a drain. The first bi-polar transistor is formed with a first emitter, a first base, and a first collector; the first emitter is connected to the source and the first collector is connected to the gate. The second bi-polar transistor is formed with a second emitter, a second base, and a second collector, the second base is connected to the first base, and the second collector is connected to the drain. The emitter bias resistor is formed with a first terminal and a second terminal; the first terminal is connected to the emitter of the second bi-polar transistor and the second terminal is connected to the emitter of the first bi-polar transistor.
The first resistor is connected between a bias voltage and the first collector; the second resistor is connected between the bias voltage and the base of the second bi-polar transistor.

6 Claims, 1 Drawing Sheet

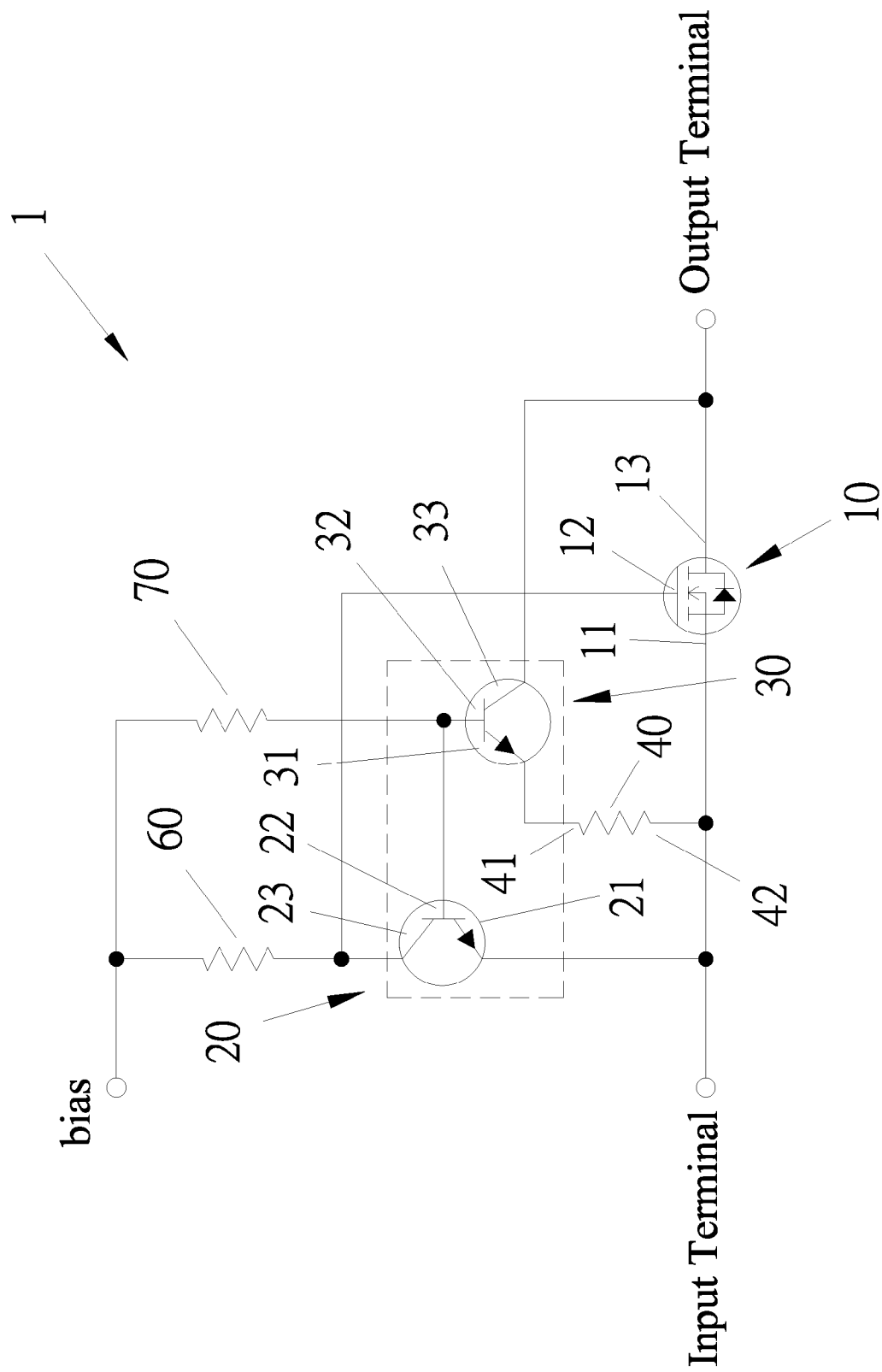

ACTIVE ISOLATION SWITCH

BACKGROUND OF THE INVENTION a) Technical Field of the Invention

This invention relates to an isolation switch and particularly to an active isolation switch for power supply.

(b) Description of the Prior Art

Nowadays, multiple power supply modules are combined to form a structure of a redundant power system. Power supply modules are connected in parallel to form a common power bus. OR-ing circuit elements are necessary to be included between the power supply's output. This is to prevent a failure of one power supply module to cause a system failure, thus achieving the redundancy requirement.

However, the existing common ORing circuit has the following drawbacks: the comparator input offsets exist and these offsets will affect the FET through a breakpoint on the FET control; when the offset is positive, it will be caused that the output current is relatively small and thus the FET does not open, and it is generally necessary to make the turn-on threshold of the comparator be closer to negative voltage limit, but in this case, it is inevitable that when the bus voltage is higher than the module voltage, there is reverse current fed back to the module from the bus, and that when the reverse current does not reach a certain threshold, the FET cannot be turned off. Also, the comparator is required in the existing ORing circuit, so the cost of the circuit get higher.

Consequently, because of the technical defects described above, to provide the improver, the applicant, based on many years of research and experience in the relevant industry, has developed the present invention, which may effectively improve the defects described above.

SUMMARY OF THE INVENTION

An active isolation switch for power supply comprises a field effect transistor (FET), a first bi-polar transistor and a second bi-polar transistor, and an emitter bias resistor. The FET may be connected between the output of the power supply and the bus. The first bi-polar transistor may have an emitter connected to the source of the FET and the collector connected to the gate of the FET. The second bi-polar may have a collector connected to the drain of the FET, a base connected to the base of the first bi-polar transistor and an emitter connected to the emitter bias resistor.

The emitter bias resistor is formed with a first terminal and a second terminal; the first terminal is connected to the emitter of the second bi-polar transistor and the second terminal is connected to the emitter of the first bi-polar transistor.

BRIEF DESCRIPTION OF THE DRAWINGS

FIG. 1 is a circuit diagram of an active isolation switch according to this invention.

DETAILED DESCRIPTION OF THE PREFERRED EMBODIMENTS

Now, the present invention will be described more specifically with reference to the following embodiments. It is to be noted that the following descriptions of preferred embodiments of this invention are presented herein for purpose of illustration and description only; it is not intended to be exhaustive or to be limited to the precise form disclosed.

With reference to FIG. 1, an active isolation switch 1 according to this invention comprises a field effect transistor (FET) 10, a first bi-polar transistor 20 and a second bi-polar transistor 30, and an emitter bias resistor 40.

The field-effect transistor (FET) 10 is formed with a source 11, a gate 12, and a drain 13; the source 11 is connected to an Input Terminal (power supply output); the drain 13 is connected to an Output Terminal (the power bus).

The first bi-polar transistor 20 is formed with a first emitter 21, a first base 22, and a first collector 23; the first emitter 21 is connected to the source 11 and the first collector 23 is connected to the gate 12 and a bias current.

The second bi-polar transistor 30 is formed with a second emitter 31, a second base 32, and a second collector 33; the second base 32 is connected to the first base 22 and the bias current, and the second collector 33 is connected to the drain 13.

The emitter bias resistor 40 is formed with a first terminal 41 and a second terminal 42; the first terminal 41 is connected to the emitter 31 of the second bi-polar transistor 30 and the second terminal 42 is connected to the emitter 21 of the first bi-polar transistor 20.

The first bi-polar transistor 20 and the second bi-polar transistors 30 are NPN transistors in a single package.

A first resistor 60 is connected between the bias voltage and the first collector 23 of first bi-polar transistor 20 and serves as the first bias current.

A second resistor 70 is connected between the bias voltage and the second base 32 of second bi-polar transistor 30.

The FET 10 serves as the active isolation switch. However, it is not a simple on-off switch. In operation, FET 10 is selectively biased to operate from cut-off, active and saturation regions. Thus allowing current only to flow in one direction, from source to drain.

The bi-polar transistors 20 and 30 and emitter bias resistor 40 are configured to form an inverting amplifier to control FET 10. The input voltage seen by the inverting amplifier is the voltage between the drain 13 and source 11 of FET 10. The output of the inverting amplifier is the collector 23 of bi-polar transistor 20 which is coupled to the gate 12 of FET 10 which controls FET 10 to its desired operating region.

At totally no current flowing on FET 10 during stand-alone operation, the voltage between the drain 13 and source 11 of FET 10 is zero thus the bi-polar transistor 20 is nearly or fully saturated making FET 10 to operate in cut-off region. This is desirable because before the current can reverse its direction, it will first become zero. The FET 10 will immediately shutdown when current becomes zero thus preventing current reversal. In case there is current reversal due to momentum and some delay, it is very limited. The small amount of reverse will even make the bi-polar transistor to saturate faster and deeper.

When small amount of current, in order of few milli-amp starts to flow on FET 10 while still in cut-off state, it will tend to generate a negative voltage from source 11 to drain 13 of FET 10. This voltage is fed into the input of the inverting amplifier. The amplified voltage is the voltage at the gate 12 of FET 10. As the current further increases, voltage at gate 12 increase making FET 10 to leave the cut-off region and slowly enters the active. While FET 10 starts to enter into the active region the voltage drop across source 11 to drain 13 of FET 10 will be dominated by the ON-resistance FET 10 over its body-diode. Increase in current flowing in FET 10 will result in increase in gate voltage on gate 12 of FET 10. However the change in gate voltage due to the change in current is not linear since the ON-Resistance is also a function gate voltage. As the gate voltage increases, the ON-resistance decreases. Thus further increasing the current flowing into FET 10 will make it go into saturation. This is desirable since the deeper the FET go into saturation, the lower the ON-resistance and the lower the ON-resistance, the lower the voltage drop thus lower power dissipation.

I claim:

1. An active isolation switch, comprising:
   a field effect transistor (FET), being formed with a source, a gate, and a drain, the source and the drain; for electrical connection and isolation between an output of the power supply (Input Terminal) and a bus (Output Terminal);
   a first bi-polar transistor, being formed with a first emitter, a first base, and a first collector, the first emitter being connected to the source and the first collector being connected to the gate; a second bi-polar transistor, being formed with a second emitter, a second base, and a second collector, the second base being connected to the first base, and the second collector being connected to the drain; and
   an emitter bias resistor, being formed with a first terminal and a second terminal, the first terminal being connected to the emitter of the second bi-polar transistor and the second terminal being connected to the emitter of the first bi-polar transistor.

2. The active isolation switch according to claim 1, wherein the first collector and the second base connected to the first bias current and second bias current respectively.

3. The active isolation switch according to claim 2, wherein the first bias current is drawn from the bias voltage coupled to the first resistor and the second bias current is drawn from the bias voltage coupled to the second resistor.

4. The active isolation switch according to claim 3, wherein the first bi-polar transistor and the second bi-polar transistor are matched-pair transistors packaged in one.

5. The active isolation switch according to claim 2, wherein the first bi-polar transistor and the second bi-polar transistor are matched-pair transistors packaged in one.

6. The active isolation switch according to claim 1, wherein the first bi-polar transistor and the second bi-polar transistor are matched-pair transistors packaged in one.

* * * * *